United States Patent [19]
Harris et al.

[11] Patent Number: 5,760,722
[45] Date of Patent: Jun. 2, 1998

[54] DISTRIBUTED QUANTIZATION NOISE TRANSMISSION ZEROS IN CASCADED SIGMA-DELTA MODULATORS

[75] Inventors: Frederick J. Harris, Lemon Grove; Robert W. Caulfield; William H. McKnight, both of San Diego, all of Calif.

[73] Assignee: The United States of America as represented by the Secretary of the Navy, Washington, D.C.

[21] Appl. No.: 381,665

[22] Filed: Jan. 31, 1995

[51] Int. Cl.⁶ ............................................. H03M 3/00
[52] U.S. Cl. .............................................. 341/143
[58] Field of Search ................................... 341/143

[56] References Cited

U.S. PATENT DOCUMENTS

| | | |
|---|---|---|
| 4,792,794 | 12/1988 | Heitmann. |
| 4,862,169 | 8/1989 | Van Bavel et al.. |
| 4,876,543 | 10/1989 | van Bavel. |
| 4,920,544 | 4/1990 | Endo et al.. |
| 5,027,120 | 6/1991 | Thurston. |
| 5,030,952 | 7/1991 | Ledzius et al.. |
| 5,055,846 | 10/1991 | Welland. |
| 5,103,229 | 4/1992 | Ribner. |
| 5,148,166 | 9/1992 | Ribner. |
| 5,148,167 | 9/1992 | Ribner. |
| 5,162,799 | 11/1992 | Tanimoto. |
| 5,181,032 | 1/1993 | Ribner. |
| 5,208,594 | 5/1993 | Yamazaki. |

OTHER PUBLICATIONS

Harris et al; New architectures with distributed zeros for improved noise shaping of delta–sigma analog to digital converters; Conference Record of The Twenty–Seventh Asilomar Conference on Signals, Systems and Computers; Nov. 1–3,1993 (Cat. No.93CH3312–6) pp. 421–425 vol. 1; Dec. 1993 IEEE.

Matsuya et al., A 16–bit Oversampling A–to–D Conversion Technology Using Triple Intergation Noise Shaping, IEEE Journal of Solid–State Circuits, vol. SC–22, pp. 921–929, Dec. 1987.

Harris et al., *On the Performance of Alternate Architectures for Noise Shaping Modulators of the Sigma Delta Type*, Proceedings of International Symposium on Signal Processing and its Applications, ISSPA 92, Aug. 19–21, 1992, pp. 45–48.

Uchimura et al, "Oversampling A–to–D and D–to–A Converters with Multistage Noise Shaping Modulators", *IEEE Transaction on Acoustics, Speech, and Signal Processing*, vol. 36, No. 12, Dec. 1988, pp. 1899–1905.

*Primary Examiner*—Howard L. Williams
*Attorney, Agent, or Firm*—Harvey Fendelman; Michael A. Kagan; Peter A. Lipovsky

[57] ABSTRACT

A series of sigma-delta modulators are connected in a cascaded architecture. Each sigma-delta modulator has a noise transfer function that defines a unique set of quantization noise transmission zeros. A circuit is coupled to the cascaded architecture and has a signal transfer function that is an approximation of the noise transfer function of a first sigma-delta modulator in the series of sigma-delta modulators.

9 Claims, 3 Drawing Sheets

DISTRIBUTED QUANTIZATION NOISE TRANSMISSION ZEROS IN CASCADED SIGMA-DELTA MODULATORS

STATEMENT OF GOVERNMENT INTEREST

The invention described herein may be manufactured and used by or for the Government of the United States for governmental purposes without the payment of any royalties thereon or therefor.

CROSS-REFERENCE TO RELATED PATENT APPLICATIONS

This patent application is co-pending with a related United States patent application titled "Sigma-Delta Modulator With Tunable Signal Passband", assigned Ser. No. 08/384,819, and filed by the same inventors as this patent application.

FIELD OF THE INVENTION

The present invention relates to the field of devices that convert analog signals to quantized or digital signals, convert digital signals to analog signals, and convert between digital signals represented by $B_1$ bits and digital signals represented by $B_2$ bits where $B_1 > B_2$, and more particularly to a cascaded sigma-delta modulator design having its quantization noise transmission zeros optimally distributed within the modulator's signal passband to improve the modulator's dynamic range and passband definition.

BACKGROUND OF THE INVENTION

A type of signal modulator used in a wide variety of signal processing applications is known as the sigma-delta (a.k.a. delta-sigma) modulator. Broadly speaking, a sigma-delta modulator is a sampled-data circuit (either analog or digital) in which a quantizer with a small number of quantizing levels, which hence introduces large qualitization error, operates within a feedback loop. By virtue of the feedback loop, the sigma-delta modulator reduces, over a specified bandwidth, the noise caused by the quantizer to a level associated with a quantizer having a significantly greater number of quantization levels. Thus, the sigma-delta modulator achieves significantly reduced quantization noise over the specified bandwidth. Accordingly, analog-to-digital (A/D), digital-to-digital (D/D) and digital-to-analog (D/A) converters are frequently based on sigma-delta modulators.

For example, in terms of A/D conversion, a sigma-delta modulator operates on an oversampled analog input signal, and features a forward path with one or more integrators and a low resolution quantizer which forms the loop feedback signal (and loop output signal). For A/D conversion, the output of the sigma-delta modulator is typically fed through a digital low-pass or bandpass down sampling output filter known as a decimation filter. However, error associated with quantization (or noise error) is introduced by the modulator's quantizer(s). The noise error created by the quantizer is typically suppressed within a design bandwidth (near d.c. for a baseband system or near an arbitrary non-zero frequency for a carrier based system) fixed by the modulator's circuitry and reflected in the noise transfer function (NTF) defined by the particular circuitry. The NTF must be stop-band over the design (signal) bandwidth so that the signal of interest resides in a low quantization error environment. The noise power residing outside the design bandwidth is filtered out by the decimation filter matched to the design bandwidth, i.e., either low-pass or bandpass. Thus, the conventional sigma-delta modulator type A/D converter operates on the principle that is known as noise shaping.

To suppress the noise error over the design bandwidth, the NTF is designed to supply one or more transmission zeros within the design bandwidth so that the noise power in the design bandwidth is suppressed along with an associated increase in noise power outside the design bandwidth. As more transmission zeros are added in the NTF, the order of the modulator increases as does the noise error suppression over the design bandwidth.

The sigma-delta modulator can include multiple integrators in association with a single quantizing loop or can consist of a cascaded or multiple-stage structure arranged so that a subsequent quantizing stage operates to measure and cancel the noise error generated by the previous stage. In doing this, the noise error levels are reduced within the design bandwidth. Reduced noise power levels in the design bandwidth are achieved by the filtering effect of the high order zeros in the NTF which can be obtained 1) through the use of a series of multiple integrators serving as input to a single quantizer, 2) by cascading multiple stages where each stage is configured such that the output of a low-order loop serves as the input to a single quantizer, or 3) through the use of combinations of these two configurations. While some configurations of such sigma-delta modulators are readily and inexpensively realized for signals of interest at low or near zero frequencies, they have not heretofore been developed for bandpass signals with a tunable or variable center frequency passband. Moreover, many configurations of single-loop sigma-delta modulators suffer from reduced operational stability (e.g., overflow oscillations, etc.) as the number of NTF transmission zeros is increased (i.e., the order is increased) within the design bandwidth. Typically, cascaded sigma-delta modulators, with NTF zeros located at d.c., increase operational stability over single-loop sigma-delta modulators of equivalent order. Thus, the need exists for cascaded sigma-delta modulators that can provide a high degree of noise suppression over a relatively wide signal bandwidth while maintaining operational stability.

SUMMARY OF THE INVENTION

In accordance with the present invention, a series of sigma-delta modulators are connected in a cascaded architecture. Each sigma-delta modulator produces a quantized output and has a noise transfer function that defines a unique set of quantization noise transmission zeros. The cascaded architecture includes a first sigma-delta modulator and a last sigma-delta modulator. A circuit is coupled to the quantized output of the last sigma-delta modulator. The circuit has its output defined by a signal transfer function that is an approximation of the noise transfer function of the first sigma-delta modulator. The quantized output of the first sigma-delta modulator is subtracted from the output of the circuit.

The present invention provides a cascaded sigma-delta modulator that is operationally stable and effectively manages multiple noise transmission zeros to provide improved dynamic range for a given signal passband.

DESCRIPTION OF THE PREFERRED EMBODIMENT

The present invention can be implemented in any m-th order sigma-delta modulator configured in any cascaded stage structure where $m \geq 2$. The order of the modulator is based on the number of integrator loops used to generate inputs for a quantizer. To better understand the present invention, a brief description is necessary regarding the structure and operation of a single-stage, multiple-loop sigma-delta modulator. However, it is to be understood that the present invention can be implemented in any m-th order sigma-delta modulator configured in any cascaded stage structure where $m \geq 2$.

Figure 1:
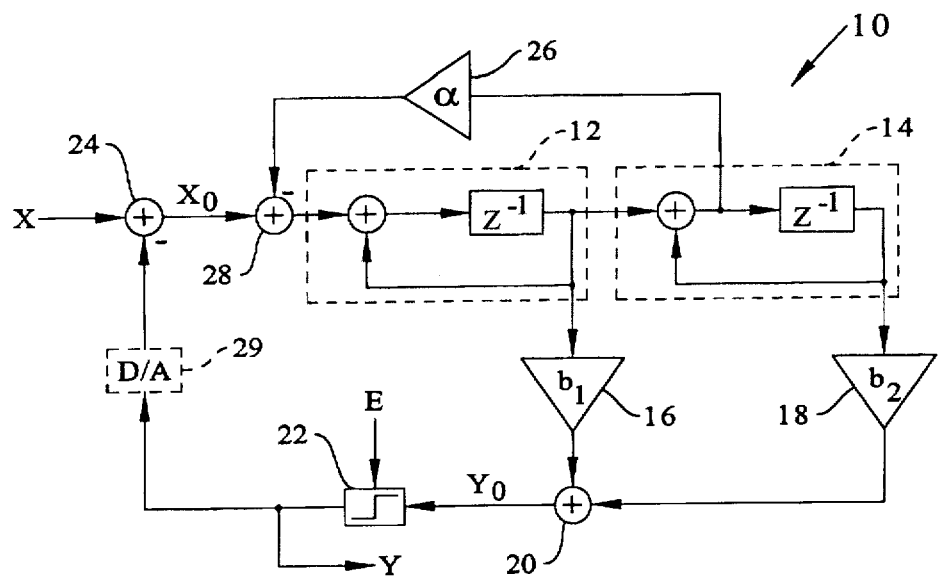
FIG. 1 is a network diagram of a prior art multiple-loop sigma-delta modulator.

A prior art multiple-loop, second-order sigma-delta modulator is shown in FIG. 1 and referenced generally by the numeral 10. In terms of A/D conversion, sigma-delta modulator 10 operates on an oversampled (e.g., typically many times Nyquist) analog input X and outputs quantized output Y. Sigma-delta modulator 10 includes two integrators 12 and 14, each with local feedback from a one clock cycle delay element $z^{-1}$. The branches from integrators 12 and 14 are scaled by respective scaling elements 16 and 18 having respective scaling coefficients defined as $b_1$ and $b_2$. The scaled outputs from scaling elements 16 and 18 are summed at summing junction 20. The resulting sum output from summing junction 20 is fed to coarse quantizer 22. Quantizer 22 introduces quantization error E in the loop. The output from quantizer 22 is delivered to D/A converter 29 where the quantized signal is converted back to an analog signal which is subtracted from sampled analog input X at input summing junction 24 to close the loop. The local feedback branch of integrator 14 is scaled by scaling element 26 having a scaling coefficient defined as "a" for the symbol alpha. The scaled output from scaling element 26 is subtracted from loop input $X_0$ at summing junction 28. As is known in the art, scaling coefficients a, $b_1$ and $b_2$ are used to fix the positions of the poles and zeros of the transfer function.

Quantizer 22 is typically a single-bit or two-level A/D converter (i.e., comparator). However, quantizer 22 can be any multi-level (e.g., a three level, a two-bit or four level, three-bit, etc.) quantizer. Digital-to-analog (D/A) converter 29 supplies the feedback signal of sigma-delta modulator 10 when modulator 10 is used in an A/D configuration. Since D/A converter 29 is not required for the D/D or D/A configurations, it is shown as a dashed line box. D/A converter 29 is required to have the same number of levels as quantizer 22. Further, since D/A converter 29 is in the feedback loop, it must exhibit the precision expected of the entire sigma-delta loop.

The Z-transform of the output Y, or Y(Z), of sigma-delta modulator 10 can be described in terms of the (closed loop) signal transfer function STF(Z), and the (closed loop) linearized noise transfer function NTF(Z) according to $$Y(Z) = STF(Z)X(Z) + NTF(Z)E(Z) \qquad (1)$$

where X(Z) is the Z-transform of the input X to sigma-delta modulator 10 and E(Z) is the Z-transform of the time domain quantization noise error E introduced by quantizer 22. In terms of the transfer function H(Z), which is defined to be $Y_0(Z)/X_0(Z)$ in FIG. 1, one can determine the STF and NTF as follows:

$$NTF = \frac{(\text{open loop gain})_{noise}}{1 - \text{loop gain}} = \frac{1}{1 + \lambda H} = \frac{1}{1 + \lambda N/D} = \frac{D}{D + \lambda N}$$

which is approximately equal to $D/\lambda N$ in the signal passband where, as is customary, the transfer function H(Z) is represented as a quotient N(Z)/D(Z) and $\lambda$ is a parameter accounting for the linearized gain of quantizer 22. Similarly, $$STF = \frac{(\text{open loop gain})_{signal}}{1 - \text{loop gain}} = \frac{\lambda H}{1 + \lambda H} = \frac{\lambda N/D}{1 + \lambda N/D} = \frac{\lambda N}{D + \lambda N}$$

which is approximately equal to 1 in the signal passband.

Since the transfer function H(Z) is expressed as $N(Z)/D(Z)$ or $Y_0(Z)/X_0(Z)$, $$N(Z)/D(Z) = \frac{b_1 Z^{-1} + (b_2 - b_1)Z^{-2}}{1 + (a-2)Z^{-1} + Z^{-2}} \qquad (2)$$

Substitution of N(Z)/D(Z) into equation (1) and using the foregoing expressions for the STF and NTF shows that the output Y(Z) relates to the input signal X(Z) and quantization noise E(Z) in terms of the sigma-delta modulator parameters of FIG. 1 as follows:

$$Y(Z) = \frac{\lambda[b_1 Z^{-1} + (b_2 - b_1)Z^{-2}]}{1 + (a - 2 + \lambda b_1)Z^{-1} + (1 + \lambda b_2 - \lambda b_1)Z^{-2}} X(Z) + \qquad (3)$$

$$\frac{1 + (a-2)Z^{-1} + Z^{-2}}{1 + (a - 2 + \lambda b_1)Z^{-1} + (1 + \lambda b_2 - \lambda b_1)Z^{-2}} E(Z)$$

Thus, the linearized noise transfer function (NTF) of sigma-delta modulator 10 describing the quantization error is $$NTF(Z) = \frac{Y(Z)}{E(Z)} = \frac{1 + (a-2)Z^{-1} + Z^{-2}}{1 + (a - 2 + \lambda b_1)Z^{-1} + (1 + \lambda b_2 - \lambda b_1)Z^{-2}} \qquad (4)$$

The value of $\lambda$ depends on the value of each analog input sample to quantizer 22 and on the number of output levels/bits provided thereby. The scaling coefficient "a" controls the positions of the poles of transfer function H(Z) along the unit circle while the "b" scaling coefficients control the positions of the zeros of transfer function H(Z). Since the transfer function poles are the (closed-loop) NTF zeros, the "a" coefficient controls the positions of the NTF zeros. The "b" coefficients in combination with the "a" coefficient and gain $\lambda$ of quantizer 22 control the positions of the (closed-loop) NTF poles and hence the stability of the closed-loop system. When the "a" coefficient is set equal to zero, the poles of the transfer function H(Z) are positioned at d.c. In addition, due to the relative size of the "b" coefficients, i.e., typically b>>a, and relationships within the (closed-loop) transfer functions, the positions of the closed-loop transfer function poles (for both signal and noise) are predominantly controlled by the "b" coefficients and quantizer gain $\lambda$.

Figure 2:
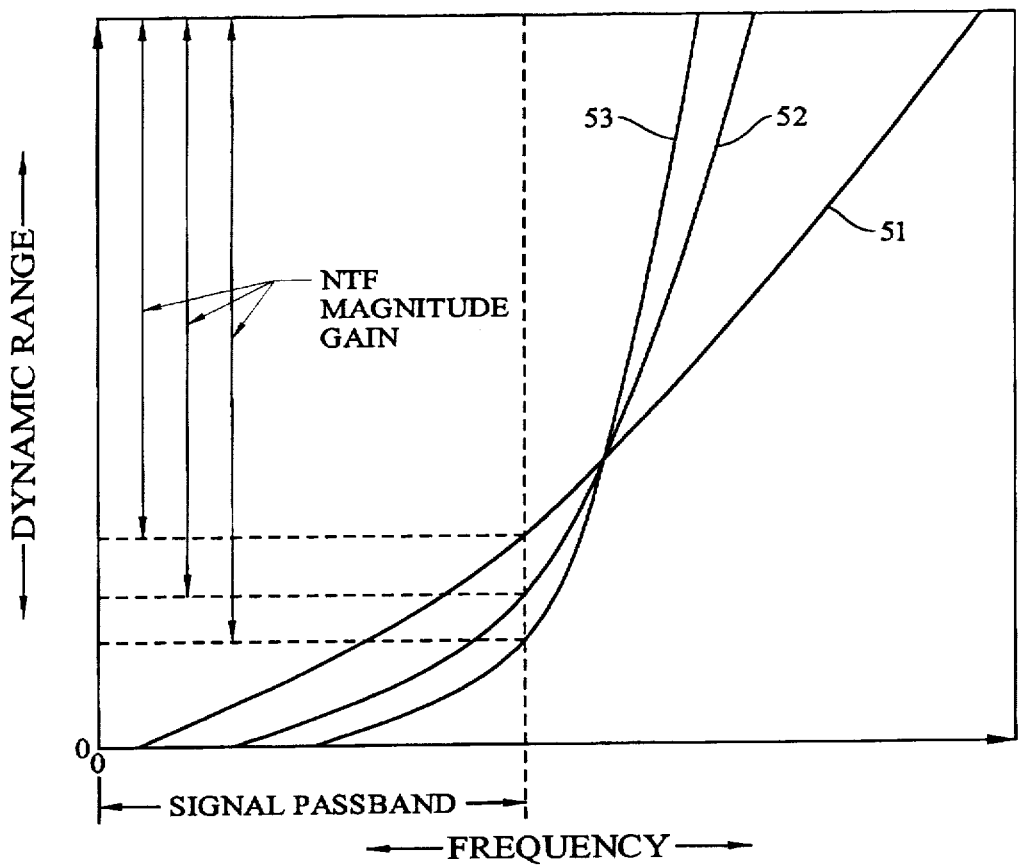
FIG. 2 is a plot of NTF magnitude gain vs. frequency for first, second and third-order sigma-delta modulators whose NTF zeros are stacked at d.c.

For a given bandwidth, noise error suppression can be increased by increasing the order of the sigma-delta modulator. Alternatively, for a given level of noise error suppression, the bandwidth can be increased by increasing the order of the sigma-delta modulator. In either case, increase in the order of the sigma-delta modulator is achieved by stacking identical, hence repeated, NTF zeros at the center of the design bandwidth. In terms of circuit design, this is accomplished by adding integrators to a sigma-delta modulator loop and/or cascading a plurality of sigma-delta modulator loops. The effects of such "zero stacking" are shown graphically in FIG. 2 where a plot of the NTF magnitude gain vs. frequency is presented for a baseband sigma-delta modulator. Curve 51 represents a first-order (i.e., one noise transmission zero) sigma-delta modulator. Curve 52 represents a second-order (i.e., two noise transmission zeros) sigma-delta modulator such as that shown in FIG. 1. Curve 53 represents a third-order (i.e., three noise transmission zeros) sigma-delta modulator. As is apparent, with the NTF zeros in the signal passband stacked (at d.c. in FIG. 2), the noise error level is lower and the dynamic range is greater for higher order sigma-delta modulators. The flatness of the noise stop-band depends on the number of repeated or stacked transmission zeros of the NTF. More repeated zeros increases the flatness of the noise stop-band thereby increasing the bandwidth for a specified dynamic range or, alternatively, providing greater noise error suppression for a given bandwidth as shown in FIG. 2.

The present invention uniformly distributes noise transmission zeros over the design bandwidth to achieve uniform (or Chebyshev) attenuation of quantization noise while still permitting the cancellation and level placement obtainable by cascading successive stages. The present invention's structure and methodology are suitable for any cascaded loop structure of second or greater order sigma-delta modulators. By way of illustrative example, the present invention will be described with the aid of FIG. 3 which depicts one such cascaded structure configured in accordance with the present invention for increased dynamic range and stability for a signal passband of interest.

Figure 3:
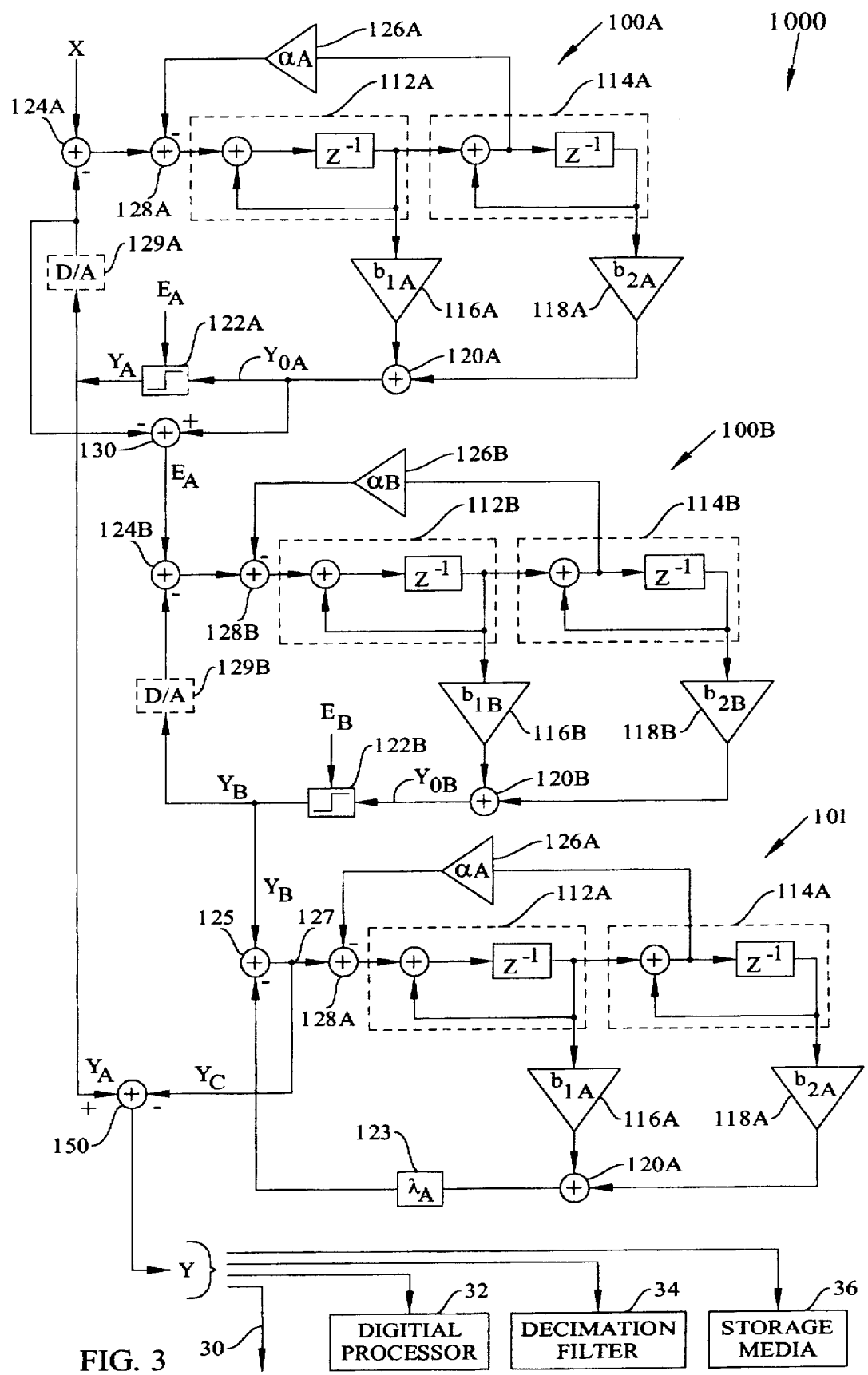
FIG. 3 is a network diagram of two sigma-delta modulators cascaded together with a third non-quantizing stage structure in accordance with the present invention.

In FIG. 3, cascaded arrangement 1000 includes two multiple-loop, second-order sigma-delta modulators 100A and 100B cascaded with a third (circuit) stage 101 having no quantizer. Each of sigma-delta modulators 100A and 100B can be constructed as shown and described above with regard to FIG. 1. Accordingly, like elements between the embodiments or FIGS. 1 and 3 have been provided with like reference numerals that are preceded by a "1" and appended with "A" or "B" as respectively relating to modulators 100A and 100B. Modulators 100A and 100B can have the same coefficients resulting in repeated system roots. However, in accordance with the present invention, modulators 100A and 100B have different coefficients to distribute the system roots over the design bandwidth. In addition, the last stage of a cascaded arrangement built in accordance with the present invention, e.g., stage 101 for cascaded arrangement 1000, is nearly identical to that of the first sigma-delta modulator stage, e.g., modulator 100A for cascaded arrangement 1000. Accordingly, like elements between modulator 100A and stage 101 share common reference designations. The difference between modulator 100A and stage 101 is that quantizer 122A in modulator 100A is replaced in stage 101 with gain element 123 having gain $\lambda_{123}$. Gain element 123 is shown in FIG. 3 to emphasize the congruence between modulator 100A and stage 101.

Note that the output port of stage 101 is the output of its input summing junction 125 (as opposed to the output ports of modulators 100A and 100B which are the outputs of their respective quantizers). Ideally, stage 101 forms a STF equal to the NTF of modulator 100A. However, since gain $\lambda_{122A}$ of quantizer 122A varies with each analog input sample, gain $\lambda_{123}$ of gain element 123 must be chosen such that the STF of stage 101 is approximately equal to the NTF of modulator 100A in order to cancel the noise from modulator 100A. In general, gain $\lambda_{123}$ is selected to be a closest approximation to gain $\lambda_{122A}$ to achieve optimum noise shaping for given dynamic range and bandwidth requirements. For example, gain $\lambda_{123}$ might be a time averaged value or a "best fit" curve to a sampling of gain values for $\lambda_{122A}$. Empirically, it has been determined that optimum performance is achieved when gain $\lambda_{123}$ is unity, i.e., gain element 123 is a short circuit. Details of this cascade of noise-processing-transfer-functions are provided below. Further, note that each of sigma-delta modulators 100A and 100B (as well as stage 101) could also incorporate a tuning transformation in each of their respective integrator loops to define a tunable signal passband as described in the aforementioned co-pending patent application entitled "Sigma-Delta Modulator with Tunable Signal Passband".

The noise transmission zero distribution is accomplished by adjusting the "a" coefficients of each sigma-delta modulator or non-quantizing stage. As the value of an "a" scaling coefficient increases from zero, the noise transmission zeros move away from d.c. Proper adjustment of the "a" coefficients uniformly and optimally distributes the noise transmission zeros across the signal passband. In other words, each stage is used to generate an independent set of noise transmission zeros. This, as will be explained further below, improves the dynamic range of the signal passband and makes the stability of the modulator resemble that of a lower order modulator.

In operation, quantization error $E_A$ is introduced by quantizer 122A and is isolated by subtracting, at summing junction 130, the output $Y_A$ of quantizer 122A (in its analog form as converted by D/A converter 129A) from the input $Y_{OA}$ of quantizer 122A. Thus, quantization error $E_A$ serves as the input to modulator 100B at summing junction 124B. The quantization error resulting from the combination of modulators 100A and 100B is then input to stage 101 at input summing junction 125. Finally, the digital output $Y_C$ from stage 101 tapped at port 127 is subtracted from the digital output $Y_A$ from modulator 100A at summing junction 150. The NTF's transmission zero distribution is accomplished by setting the "a" coefficients to different values for each of modulator's 100A and 100B. As the value of the "a" scaling coefficient increases from zero, the multiple NTF zeros move away from d.c.

The noise processing provided by the present invention is analyzed as follows. Output port 127 of stage 101 is the output of input summing junction 125. As mentioned above, stage 101 ideally forms a STF (signal transfer function) equal to the NTF (noise transfer function) of modulator 100A. However, because gain $\lambda_{122A}$ of quantizer 122A depends on the value of each analog input sample, gain $\lambda_{123}$ must be selected to achieve optimum noise shaping for a particular application's dynamic range and bandwidth requirements.

Modulator 100B measures noise $E_A$ generated by quantizer 122A in modulator 100A. In the process of measuring noise $E_A$, modulator 100B forms a spectrally shaped version of noise $E_B$ generated by quantizer 122B. Thus, the (Z-transform) output of modulator 100B (i.e., the noisy measured noise of quantizer 122A) is denoted in FIG. 3 as $Y_B$ and is of the form:

$$Y_B = (E_A)STF_{100B} + (E_B)NTF_{100B} \tag{5}$$

where the "Z"'s have been omitted for simplicity in this and the remaining equations in the description. $STF_{100B}$ is the signal transfer function of modulator 100B and $NTF_{100B}$ is the noise transfer function of modulator 100B. The output of modulator 100A is denoted in FIG. 3 as $Y_A$ and is of the form:

$$Y_A = X \, STF_{100A} + E_A NTF_{100A} \tag{6}$$

where $STF_{100A}$ is the signal transfer function of modulator 100A and $NTF_{100A}$ is the noise transfer function of modulator 100A. By applying an STF of stage 101 that is an approximation of the NTF of modulator 100A to output $Y_B$ of modulator 100B, output $Y_C$ of stage 101 is of the form:

$$Y_C = Y_B STF_{101} = E_A STF_{100B} STF_{101} + E_B NTF_{100B} STF_{101} \qquad (7)$$

or $$Y_C = E_A STF_{100B} NTF_{100A} + E_B NTF_{100B} NTF_{100A} \qquad (8)$$

The term $E_A STF_{100B} NTF_{100A}$ in output $Y_C$ corresponds, within gain term $STF_{100B}$, to the shaped noise term $E_A NTF_{100A}$ at output $Y_A$ of modulator 100A. The gain term $STF_{100B}$ is nearly unity so that the term $E_A STF_{100B} NTF_{100A}$ is, to a high order approximation, equal to the shaped noise term $E_A NTF_{100A}$. Therefore, the shaped noise term $E_A NTF_{100A}$ present in $Y_A$ and $Y_C$ can be canceled or significantly reduced by forming the difference between $Y_A$ and $Y_C$ at summing junction 150. This output, denoted in FIG. 3 by Y, is of the form:

$$Y = Y_A - Y_C = X\, STF_{100A} + E_A NRF_{100A} - E_A STF_{100B} NTF_{100A} - E_B NTF_{100B} NTF_{100A} \qquad (9)$$

which can be simplified to $$Y = X\, STF_{100A} - E_B NTF_{100B} NTF_{100A} \qquad (10)$$

Thus, the present invention provides a STF that is an approximation of the desired NTF by replacing the shaped noise term $E_A NTF_{100A}$ (formed by modulator 100A) with the "doubly" shaped noise term $E_B NTF_{100B} NTF_{100A}$ (formed by applying the NTF of modulator 100A—as implemented by the STF of stage 101—to the shaped noise $E_B NTF_{100B}$ formed by modulator 100B).

Figure 4:
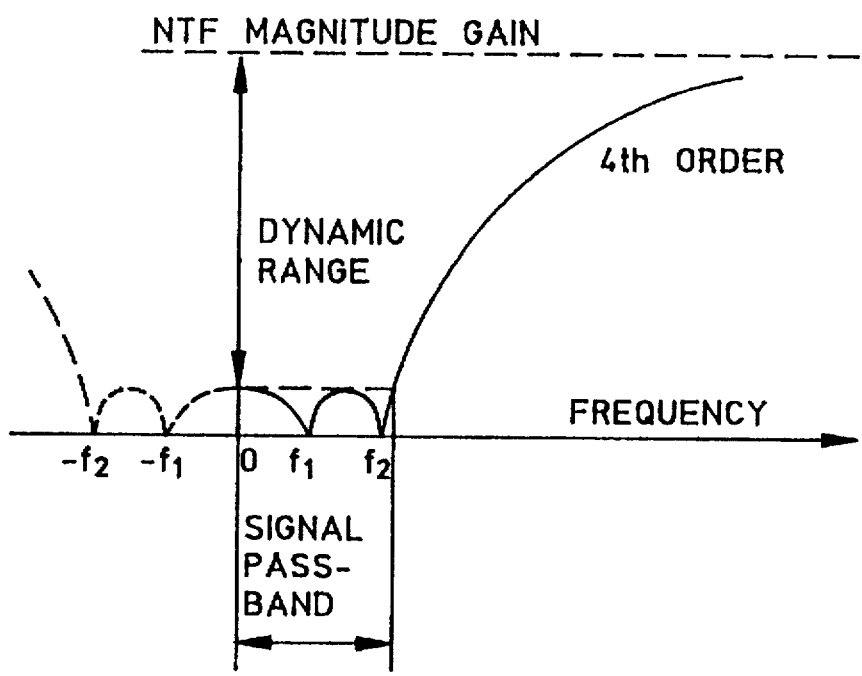
FIG. 4 is a plot of NTF magnitude gain vs. frequency for the network of FIG. 3.

The structure of FIG. 3 yields an NTF magnitude gain vs. frequency plot as depicted in FIG. 4. There are a total of four zeros occurring at $f_1$, $f_2$, $-f_1$ and $-f_2$. The zeros at $f_1$ and $-f_1$ are formed by modulator 100A and the zeros at $f_2$ and $-f_2$ are formed by modulator 100B. (Note that the "negative" frequencies represent the conjugate zeros.) Since each of modulators 100A and 100B shapes the noise spectrum, proper adjustment of the scaling coefficients distributes the zeros within the signal passband. This improves the dynamic range for the signal passband and does so with greater stability. The present invention allows a lower order sigma-delta modulator to be used to achieve the performance (in terms of dynamic range and bandwidth) previously only achievable with higher order devices that are traditionally less stable.

As shown in FIG. 3, the output Y can simply be transmitted over data channel 30. Output Y could also be input to digital processor 32 to undergo additional digital processing. Output Y could also be input to decimation filter 34 in which case a sigma-delta A/D converter is formed. If output Y is in a signal passband tuned away from d.c., decimation filter 34 could be implemented as disclosed in detail in the aforementioned co-pending application entitled "Digital Mixing to Baseband Decimation Filter". Still further, output Y could be input to storage media 36. Thus, it is apparent that the present invention will find great utility in a wide variety of signal processing applications.

Although the invention has been described relative to a specific embodiment thereof, there are numerous variations and modifications that will be readily apparent to those skilled in the art in light of the above teachings. It is therefore to be understood that, within the scope of the appended claims, the invention may be practiced other than as specifically described.

What is claimed as new and desired to be secured by Letters Patent of the United States is:

1. An apparatus, comprising:

a plurality of sigma-delta modulators connected in a cascaded architecture, each of said plurality of sigma-delta modulators having a noise transfer function that defines a unique set of quantization noise transmission zeros; and circuit means coupled to said cascaded architecture of said plurality of sigma-delta modulators, said circuit means having a signal transfer function that is an approximation of a noise transfer function of a first of said plurality of sigma-delta modulators.

2. An apparatus as in claim 1 wherein each of said plurality of sigma-delta modulators includes m integrators.

3. An apparatus as in claim 2 wherein $m \geq 2$.

4. An apparatus as in claim 1 wherein each of said plurality of sigma-delta modulators is tuned to a selected passband.

5. An apparatus, comprising:

a plurality of sigma-delta modulators connected in a cascaded architecture, each of said plurality of sigma-delta modulators producing a quantized output and having a noise transfer function that defines a unique set of quantization noise transmission zeros, said cascaded architecture including a first sigma-delta modulator receiving an input to be conditioned and a last sigma-delta modulator;

circuit means coupled to said quantized output of said last sigma-delta modulator, said circuit means having an output defined by a signal transfer function that is an approximation of a noise transfer function of said first sigma-delta modulator; and means for differencing said quantized output of said first sigma-delta modulator with said output of said circuit means.

6. An apparatus as in claim 5 wherein each of said plurality of sigma-delta modulators includes m integrators.

7. An apparatus as in claim 6 wherein $m \geq 2$.

8. An apparatus as in claim 5 wherein each of said plurality of sigma-delta modulators is tuned to a selected passband.

9. An apparatus as in claim 5 further comprising a decimation filter coupled to said means for differencing.

* * * * *